(12) United States Patent
Muff et al.

(10) Patent No.: US 8,183,676 B2
(45) Date of Patent: May 22, 2012

(54) MEMORY CIRCUIT HAVING MEMORY CHIPS PARALLEL CONNECTED TO PORTS AND CORRESPONDING PRODUCTION METHOD

(75) Inventors: Simon Muff, Mering (DE); Hermann Ruckerbauer, Moos (DE)

(73) Assignee: Qimonda AG, Munich (DE)

( * ) Notice: Subject to any disclaimer, the term of this patent is extended or adjusted under 35 U.S.C. 154(b) by 642 days.

(21) Appl. No.: 11/737,108

(22) Filed: Apr. 18, 2007

(65) Prior Publication Data

US 2007/0246257 A1    Oct. 25, 2007

(30) Foreign Application Priority Data

Apr. 18, 2006   (DE) .................. 10 2006 017 947

(51) Int. Cl.
   *H01L 23/02* (2006.01)
   *H01L 21/00* (2006.01)
(52) U.S. Cl. ......... 257/686; 257/777; 438/108; 438/109
(58) Field of Classification Search .................. 257/686, 257/777; 438/108, 109
See application file for complete search history.

(56) References Cited

U.S. PATENT DOCUMENTS

| | | | |
|---|---|---|---|
| 4,851,834 A * | 7/1989 | Stockebrand et al. | 345/554 |
| 6,376,904 B1 * | 4/2002 | Haba et al. | 257/686 |
| 7,037,757 B2 * | 5/2006 | Fox et al. | 438/109 |
| 7,422,930 B2 * | 9/2008 | Thomas et al. | 438/109 |
| 2004/0164393 A1 | 8/2004 | Fox et al. | |
| 2005/0194674 A1 | 9/2005 | Thomas et al. | |

* cited by examiner

*Primary Examiner* — Howard Weiss
*Assistant Examiner* — Steven Rao
(74) *Attorney, Agent, or Firm* — Dicke, Billig & Czaja, PLLC (57) ABSTRACT

A memory circuit includes multiple memory chips configured to store data and disposed in at least one stack. The memory circuit includes multiple ports configured to receive and transmit control signals and data to and from the memory chips and to supply energy to the memory circuit. The memory circuit includes a housing accommodating the multiple memory chips and the multiple ports.

31 Claims, 4 Drawing Sheets

MEMORY CIRCUIT HAVING MEMORY CHIPS PARALLEL CONNECTED TO PORTS AND CORRESPONDING PRODUCTION METHOD

CROSS-REFERENCE TO RELATED APPLICATIONS

This Utility Patent Application claims priority to German Patent Application No. DE 10 2006 017 947.1 filed on Apr. 18, 2006, which is incorporated herein by reference.

BACKGROUND

A memory module typically includes a small printed circuit board which is provided with memory chips, such as dynamic random access memories (DRAMs). Memory modules typically form or extend, for example, the working memory of electronic devices, such as computers or printers. A special type of memory module is a dual inline memory module (DIMM) which includes two rows of contact pins, one on the front side and one on the rear side of the printed circuit board respectively.

One or several memory modules are typically controlled by a memory controller. In order to design this memory controller, knowledge of the longest distance of a line (i.e., a trace) between the memory controller and a memory chip which is to be controlled by the memory controller, which is generally located inside a memory module, is of interest by reason of the running time which is to be taken into consideration by the memory controller. Accordingly, a distinction is made between: a short line (e.g., approximately 5 cm), such as for graphics applications; a medium length line (e.g., approximately 20 cm), such as for personal computers (PCs); and, a long line of more than, for example, 30 cm, such as for connections in a backplane.

Since the reuse of components plays a significant role in today's semiconductor industry, most memory controllers are currently designed for a medium line length, although assemblies which by reason of their configuration could operate with a memory controller designed for a short line length, would be advantageous by reason of their shorter running time and thus higher clock frequency of the memory controller with respect to a memory controller for a medium length line.

However, the length of the line is also typically determined in particular by the dimensions and designs of the memory modules.

SUMMARY

One embodiment provides a memory circuit including multiple memory chips configured to store data and disposed in at least one stack. The memory circuit includes multiple ports configured to receive and transmit control signals and data to and from the memory chips and to supply energy to the memory circuit. The memory circuit includes a housing accommodating the multiple memory chips and the multiple ports.

BRIEF DESCRIPTION OF THE DRAWINGS

The accompanying drawings are included to provide a further understanding of the present invention and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Embodiments relate to a memory circuit, such as one which has the functionality of a memory module, to an assembly which is equipped with such a memory circuit, and to a production method for manufacturing of such a memory circuit.

Figure 1:
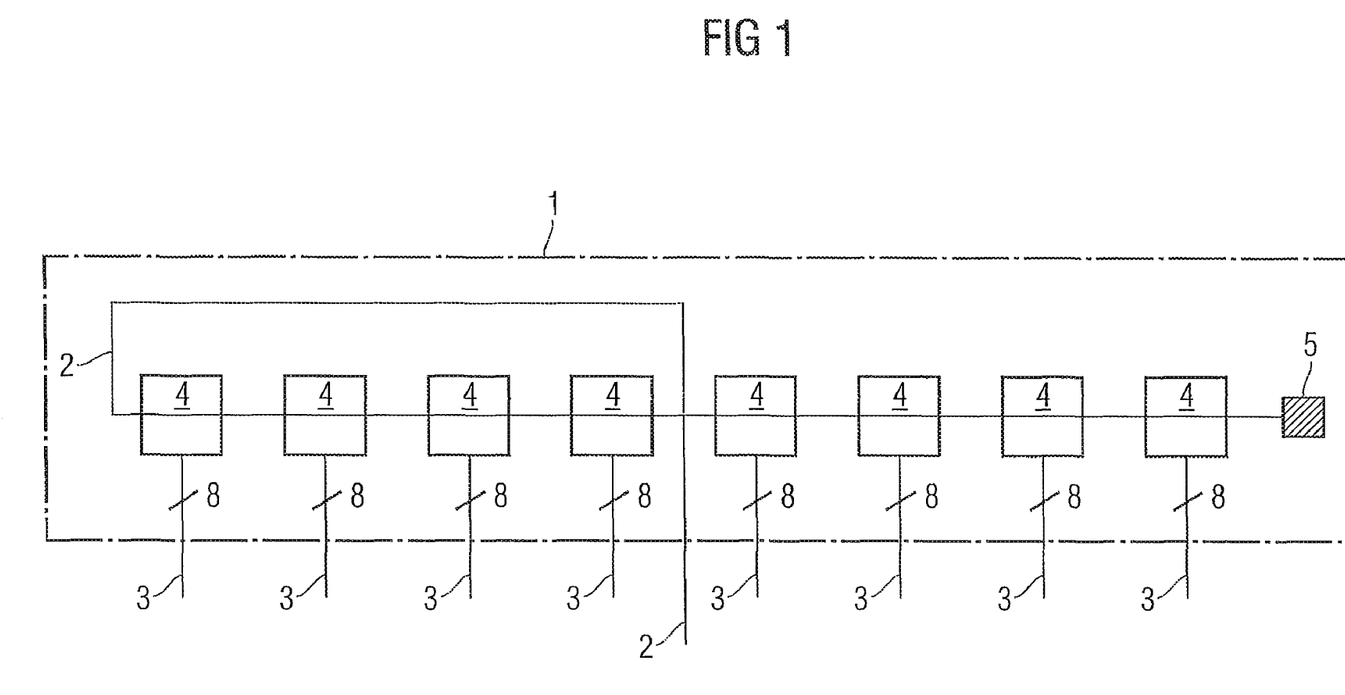
FIG. 1 illustrates a memory module.

FIG. 1 illustrates an example memory module 1 which includes eight memory chips 4 which are soldered adjacent to one another on to a printed circuit board. The memory module 1 illustrated in FIG. 1 is designed in such a manner that it can read or write 64 bit-wide words. To this end, eight bits which can be accessed via the data query (DQ)-lines 3 are read in each case by all eight memory chips 4 simultaneously during a read cycle. In a similar manner, 64 bits are written, namely eight bits to each memory chip 4, simultaneously during a write cycle. In order to control the eight memory chips 4, the command address (CA)-bus 2 is looped via all eight memory chips 4. In order to obviate specific types of reflections, the CA-bus 2 is structured to connect the eight memory chips 4 in the form of a daisy chain. Therefore, the line which is to be taken into consideration by the memory controller of the memory module 1 is longer than the distance from the memory chip 4 located at the far left to the memory chip 4 located at the far right as illustrated in FIG. 1.

The example memory module 1 illustrated in FIG. 1 also includes an serial presence detect (SPD)-chip (e.g., an EEPROM with, for example, 2 kB memory capacity) in which information relating to the memory module 11 is stored, the information being of interest to the memory controller of the memory module 1. This information includes, for example, the maximum frequency, at which the memory module 1 can be operated, and set-up times and hold-times.

As illustrated in FIG. 1, such a memory module 1 has relatively large dimensions, whereby the length of the line which is relevant for the memory controller is relatively large, whereby the possible signaling speed between the memory controller (e.g., a microprocessor) and the memory module(s) is negatively limited upwards.

Conventionally, this problem can only be solved as follows. In one example solution, special small outline (SO)-DIMMs can be employed which however still include a topology for the CA-bus, leading to limitations in the signaling speed between the memory controller and the memory module. Another solution is to directly soldering on to the mother board of (e.g., four or eight DRAMs), whereby, however, a relatively large amount of space around the controller is taken up. Another solution is to reduce the number of DRAMs which, however, negatively signifies that, under certain circumstances, no standardized memory controller which operates with a 64 bit-wide bus can be used. In this type of solution, specifically designed and thereby expensive memory controllers would have to be used. A further option is to use a standardized memory controller and DRAMs which operate with 32 bit-wide words. In the case of both variations, the memory capacity is reduced. In a normal case, the memory controller is disposed on the mother board. However, even in the case of this variation a line on the board includes a medium line length of for example 20 cm, with corresponding restrictions of the signaling speed.

One embodiment of a memory circuit (e.g., a random access memory (RAM)), is provided which includes several memory chips (e.g., DRAMs) to store data, and several ports in order to transmit control signals and data to the memory chips and to receive and relay data from the memory chips. In one embodiment, the memory chips are also supplied with energy via the ports. The memory chips of the memory circuit embodiment are disposed one on top of the other in one or several stacks. Furthermore, the memory circuit embodiment has a dedicated housing. In one embodiment, the memory circuit has the functionality of a memory module, (e.g., a DIMM).

Since the memory chips of the memory circuit embodiment are disposed one on top of the other in one or several stacks, the distances between two memory chips located in a stack is shorter than is the case in conventional memory circuits, wherein the memory chips are disposed adjacent to one another, as illustrated in FIG. 1. Therefore, a memory controller which is designed for the memory circuit according to embodiments take into consideration a shorter line length than is the case according to the conventional memory circuits. Furthermore, the memory circuit according to embodiments includes a simpler topology than is the case, for example, in current DIMMs. Finally, differences between line lengths for connection lines between the memory controller and memory chips are smaller according to embodiments than in DIMMs which are used conventionally.

In one embodiment, by reason of the memory chips which are disposed one on top of the other, the dimensions in the length or width direction are smaller than in the case of a conventional memory module. As a consequence, the memory circuit according to embodiments can be installed more effectively into devices, in which the space requirement plays a role, such as, for example, in the case of mobile devices (e.g., mobile phones).

In one embodiment, the memory chips can be disposed in the memory circuit in such a manner that the longest connection line from one of the ports of the memory circuit to a port of one of the memory chips is not longer than the sum of the longest edge length of one of the memory chips and the height of the memory circuit.

In one embodiment, if the memory chips used in the memory circuit are identical in construction, the length of the longest connection line from one port of the memory circuit to a port of a memory chip is at most equal to the sum of the longitudinal edge of a memory chip (provided that the longitudinal edge is not shorter than the edge in the width direction) and the height of the memory circuit.

Whereas conventionally the longest connection from one port of a memory module to a port of a memory chip inside the memory module is greater than the product of the number of memory chips in the memory module and the edge length of a memory chip, the longest connection according to one embodiment is not longer than the sum of the longitudinal edge of a memory chip and the height of the memory circuit. Since the height of the memory circuit is generally less than the edge length of a memory circuit, the longest connection in the case of a memory circuit according to this embodiment is shorter by a factor than in a conventional memory module, wherein the greater the number of memory chips in a memory circuit, the greater this factor.

In the case of one example embodiment of the memory circuit, the maximum length between a port of the memory circuit and a port of a memory chip amounts to 2 cm.

If the maximum length amounts to only 2 cm, a memory controller for the memory circuit according to embodiments can be designed to a short line length (e.g., 5 cm).

The memory circuit according to embodiments can also include an SPD or memory for storing control information to control the memory circuit.

If the memory circuit according to embodiments includes an SPD, a control device, (e.g., a microprocessor), which controls the memory circuit according to embodiments can be adjusted to the characteristics (e.g., maximum clock frequency) of the memory circuit and thus operate the memory circuit according to embodiments in an optimum manner. Since the SPD is a component of the memory circuit, less space is employed than for a variation, in which the SPD is disposed as a dedicated chip adjacent to the memory circuit according to embodiments.

The ports of one embodiment of a memory circuit are, in particular, soldering points or balls which are disposed mostly on the underside of the memory circuit. The soldering points or balls can be disposed, for example, in 15 rows of 20 soldering points or balls respectively. Therefore, the memory circuit according to this embodiment can be placed on a printed circuit board in an extremely space-saving manner by using the soldering points or balls.

In one embodiment, a CA-signal emanating from a single point can be distributed in a star-like manner to a specific port of each memory chip. This applies to all CA-signals.

In one embodiment, since the CA-signals are distributed in a star-like manner to the memory chips, the running time of the CA-signals in comparison with conventional memory circuits is shorter not only by reason of the smaller distances between the memory chips (as they are disposed at least partially one on top of the other), but also by reason of the selected star-shaped topology for signal guidance of the CA-signals in comparison with the conventional daisy chain topology (see FIG. 1).

However, in one embodiment, it is also possible to connect the memory chips to vias, wherein a via extends through all memory chips of a stack. This connection technique is also referred to as "through silicon via". The memory chips are connected by vias in a daisy chain topology. However, since the length of the vias is less than the height of a stack, the length of the vias is substantially shorter than lines which in the case of a conventional DIMM connect the individual, adjacently disposed memory chips together, so that even in the case of this variation according to this embodiment the running time of the CA-signals is less than in the case of current DIMMs.

According to another embodiment there is also provided a memory assembly which includes at least one memory circuit according to an embodiment and a controller for this at least one memory circuit.

Therefore, according to embodiments one or several memory circuits, which have the functionality of memory modules, together with the associated controller can form an assembly which has smaller dimensions than a conventional memory module. In other words, this type of memory assembly according to embodiments while employing less space not only has a larger memory capacity (if the memory assembly includes more than one memory circuit), but also includes in addition the controller which is conventionally disposed outside the memory module on a dedicated printed circuit board.

In comparison with a conventional memory controller which is disposed on the mother board and must therefore deal with long and complex connections to its memory modules, the controller which is disposed on the printed circuit board according to an embodiment can be designed in a relatively simple manner, as it handles only the connections, which are located on the same printed circuit board, to its memory circuit(s), and the connection to the central processing unit (CPU). This applies particularly if only one memory circuit according to an embodiment is connected to the controller, (i.e. the memory assembly includes only one memory circuit).

In the case of an example embodiment, the distance between the controller of the memory assembly and the memory circuit or each memory circuit is less than 4 cm.

As a consequence, it is possible according to an embodiment to design the controller for the memory assembly to a line length of approximately 5 cm. In one embodiment, this means that with respect to the controller, the maximum line length for lines between the controller and the individual memory chips which are disposed in the memory circuit(s) is, for example, 5 cm. As a consequence, the memory assembly can be operated at a higher clock frequency than if the controller was designed for a longer line length.

Therefore, the same memory controller which is designed to a line length of, for example, 5 cm and can conventionally be used only for specific applications (e.g., graphics applications) can now also be used in an application field (e.g., PCs) which before was reserved only for memory controllers which were designed to a line length of, for example, 20 cm , provided that the memory circuit according to embodiments or the memory assembly according to embodiments is used.

Embodiments also provide a production method for producing a memory circuit embodiment. This memory circuit embodiment includes several memory chips, which store data, and several ports, via which control signals and data are received and transmitted to the memory chips and via which data is received by the memory chips and relayed. In this embodiment, these ports supply the memory circuit and thus the memory chips contained therein with energy. In this embodiment, during production of the memory circuit, the memory chips are disposed in one or in several stacks inside a housing of the memory circuit.

Certain advantages of this production method embodiment and thus of the memory circuit embodiment produced by this production method correspond to previously described advantages of memory circuit embodiments.

Embodiments are suited to use in mobile devices, (e.g., mobile phones or laptops). Of course, embodiments are not, however, limited to this field of application but can also be used for example, in normal PCs, in order to increase inter alia the clock rate, at which the working memory of the PC is operated.

Hereinafter, embodiments are described in more detail with reference to the drawings.

Figure 2A:
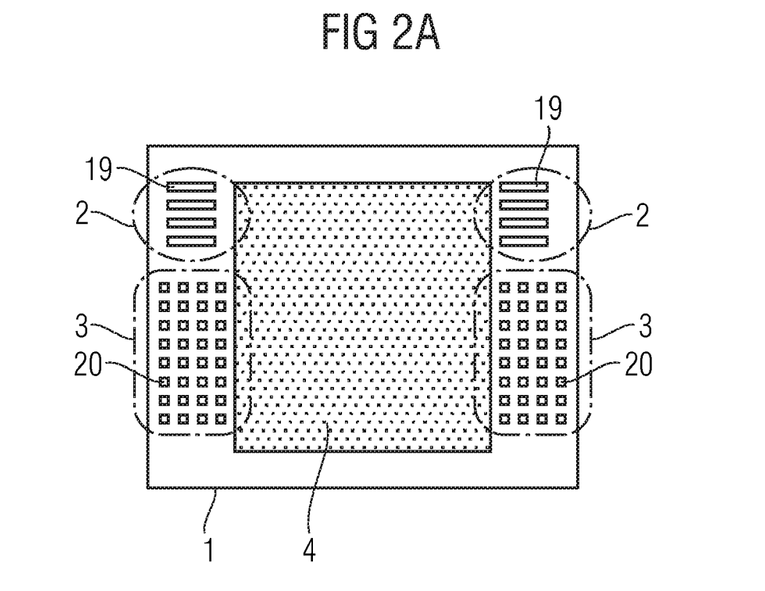
FIGS. 2A-C illustrate one embodiment of a memory circuit in which the memory chips are disposed in a stack.
Figure 2B:
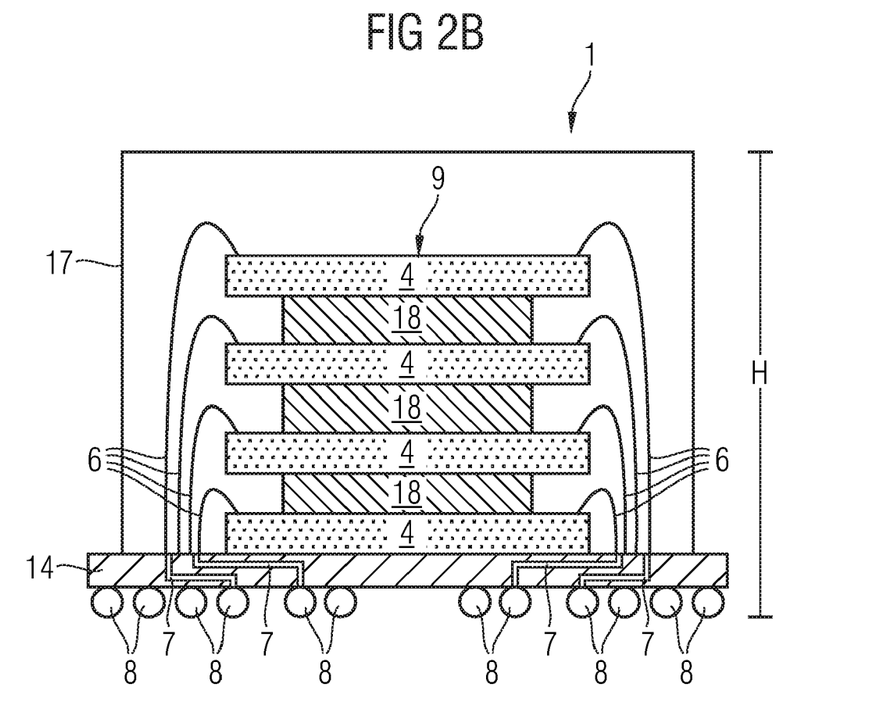

FIGS. 2A and B illustrate one example embodiment of a memory circuit 1. FIG. 2A illustrates a plan view of the memory circuit 1 and FIG. 2B illustrates a cross-section of the memory circuit 1. In this embodiment, the memory circuit 1 includes four memory chips 4 which are disposed one on top of the other in a stack 9 on a substrate 14. The lowermost memory chip 4 is applied directly on the substrate 14, whereas the three memory chips 4 disposed above are each placed on a resin layer 18 which is applied to the topside of the respective memory chip 4 disposed therebelow. In other words, a resin layer 18 is located in each case between two memory chips 4 which are disposed one on top of the other.

Figure 2C:
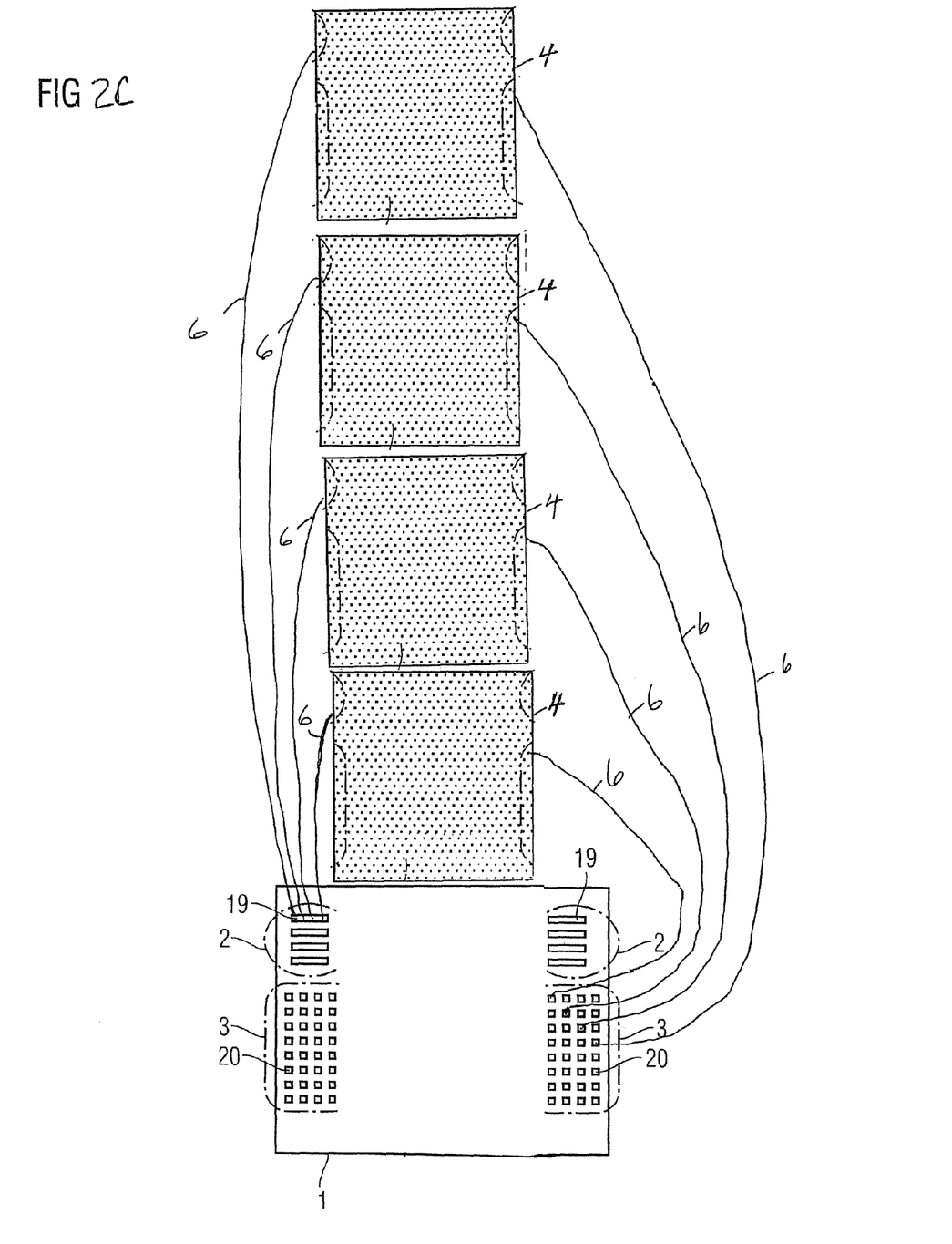

In the example embodiment, the underside of the substrate 14 is provided with soldering points or balls 8 as ports of the memory circuit 1 which are disposed in 15 rows of 20 balls 8 in each case. The distance between a centre point of a ball 8 and a centre point of a ball 8 adjacent thereto amounts to 0.8 cm, thus producing an area of approximately 16 mm×12 mm for the balls 8. A track conductor 7 leads from each ball 8 through the substrate 14 to a contact 19, 20 on the topside of the substrate 14. In so doing, the contacts 20 which are associated with the DQ-lines or the DQ-region 3 are square in formation, whereas the contacts 19 which are associated with CA-bus or the CA-region 2 are rectangular in formation. The reason for this is that the contacts 20 of the DQ-region 3 are each only connected to one bond-wire 6, whereas the rectangular contacts 19 of the CA-region 2 are each connected to four bond-wires 6, for which reason the length of the rectangular contacts 19 is longer than the width by more than the factor 4. In turn, the reason for this is that the square contacts 20 of the DQ-region 3 are connected in each case to only one port of a memory chip 4, whereas the rectangular contacts 19 of the CA-region 2 is connected to all four memory chips 4. Whereas namely the CA-signals are directed to all memory chips 4, the DQ-signals each belong only to one memory chip 4. FIG. 2C is an illustrative diagram illustrating four example square contacts 20 of the DQ-region 3 connected in each case to only one port of a memory chip 4 via four corresponding example bond-wires 6 and illustrating one example rectangular contact 19 of the CA-region 2 connected via four example bond-wires 6 to all four memory chips 4.

In this example embodiment, each memory chip 4 stores 16 bits of a 64 bit-long word. The two inner rows each with eight contacts 20 are influenced with 16 DQ-signals which are connected with the lowermost memory chip 4 and supply same with 16 data bits or read 16 data bits from the memory chip 4. The two second innermost rows each also with 8 contacts 20 supply the second lowermost memory chip with 16 data bits or read 16 data bits from this memory chip 4. Equally, the two outer rows each with 8 contacts 20 are connected to the uppermost memory chip 4 and the two second outermost rows are connected to the second uppermost memory chip 4 and supply these two memory chips 4 with 16 DQ-signals in each case, in order to write and/or read 16 bits to/from these two upper memory chips 4.

In this example embodiment, the stack 9 together with the bond-wires 6 is surrounded by a housing 17 of the memory circuit 1 which is disposed on the substrate 14. Together with the balls 8 and the housing 17, the memory circuit 1 has a height H.

In the example embodiment illustrated in FIGS. 2A and B, each ball 8 is connected via a track conductor 7 and a bond-wire to at least one port of one of the four memory chips 4 (as stated above, a ball 8 which carries a CA-signal is connected to four ports, in each case one on each memory chip 4 and a ball 8 which carries a DQ-signal is connected to exactly one port on one memory chip 4). Conversely, each port of one of the four memory chips 4 is connected via a bond-wire 6 and a track conductor 7 to a ball 8.

In the example embodiment illustrated in FIGS. 2A and B the contacts 19, 20 are disposed next to the stack 9 only on the right-hand side and left-hand side in FIG. 2A, the contacts 19, 20 can naturally also be disposed on only one side of the stack 9 or on all four sides of the stack 9.

Since the memory chips 4 are disposed in accordance with embodiments one on top of the other, a line length for supplying all four memory chips 4 with the same CA-signal is substantially shorter than is the case according to conventional designs, wherein the memory chips are disposed adjacent to each other (see FIG. 1). For this reason, faults due to reflections particularly with regard to CA-signals are substantially less disruptive in comparison with these conventional designs, for which reason the corresponding CA-ports on the four memory chips can be supplied in a star-like manner, starting in each case from one contact 19 in the CA-region 2, whereas the CA-ports of conventional memory chips are connected in the form of a daisy chain. This applies also if the memory chips 4 are disposed in several stacks (see FIG. 3).

Figure 3A:
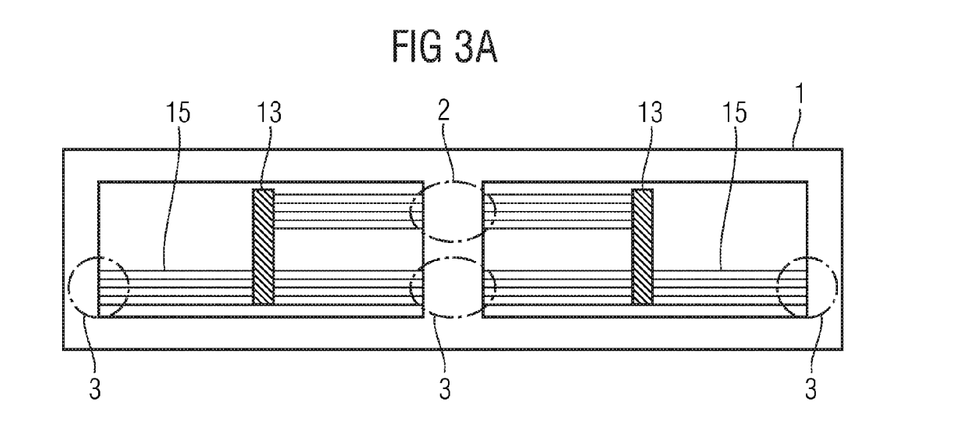
FIGS. 3A-B illustrates one embodiment of a memory circuit in which the memory chips are disposed in two stacks located adjacent to each other.

FIGS. 3A and B illustrate an example embodiment of a memory circuit 1. In this example embodiment, four memory chips 4 are disposed in two adjacent stacks 9 of two memory chips 4 in each case. Since the example embodiment of FIGS. 3A and B corresponds in substantial parts to the example embodiment of FIGS. 2A and B, only the differences will be described hereinunder.

In the example embodiment as illustrated in FIG. 3A, the CA-region 2 which includes the rectangular contacts 19 (not illustrated in FIG. 3a) is disposed only in the upper region between the two stacks 9. This example embodiment has the advantage that from one contact 19 all four memory chips in the two stacks 9 are supplied with CA-signals via the bond-wires 6. The contacts 20 (not illustrated in FIG. 3A) of the DQ-region 3 are disposed on the one hand in the lower region between the two stacks 9 as well as on the right-hand side next to the right-hand stack 9 and on the left-hand side next to the left-hand stack (in FIG. 3A).

FIG. 3A also schematically illustrates the spine 13 which is contained in each memory chip 4 and which for reasons of simplification is not depicted in the case of the memory chips 4 of FIGS. 2A and B. Furthermore, FIG. 3A also illustrates the RDL 15. The RDL 15 is used to displace ports of the memory chip 4 to the edge, so that these ports can also be connected by using bond-wires 6 even in those particular memory chips 4, in which a further memory chip 4 is disposed thereabove. The further away a port of a memory chip 4 is disposed from the edge of the memory chip, the more difficult it is to contact this port with a bond-wire 6, if yet another memory chip 4 is located above this memory chip 4.

Figure 3B:
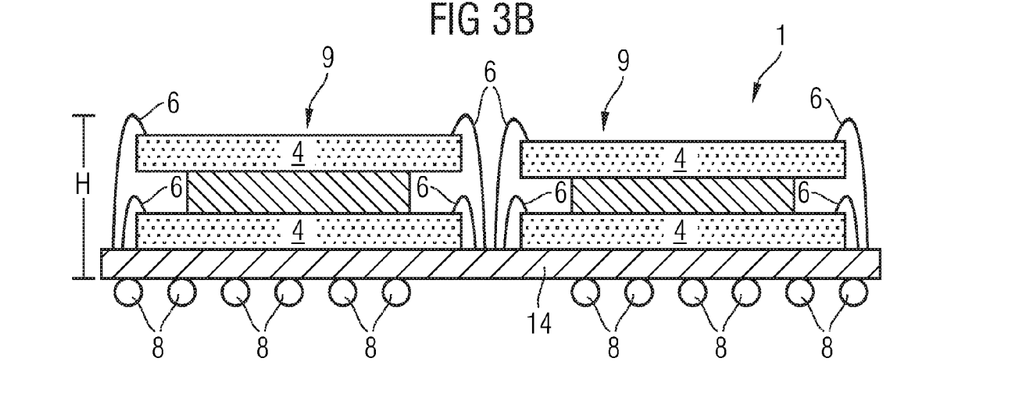

In comparison with the example embodiment illustrated in FIGS. 2A and B, the example embodiment of a memory circuit 1 as illustrated in FIGS. 3A and B has a lower height H but in return is virtually twice the width. With regard to a line length between a ball 8 and a port of the uppermost memory chip 4, the example embodiment in FIGS. 3A and B has advantages over the example embodiment in FIGS. 2A and B by reason of the lower height H. A further advantage of the example embodiment of FIGS. 3A and 3B is that in comparison with the example embodiment of FIGS. 2A and B the memory circuit has more space for the balls 8 on the underside of the substrate 14 below the two stacks 9, so that in the example embodiment of FIGS. 3A and B all of the balls 8 can be disposed more simply in one area which is equal to the surface area of the two stacks including the area required by the contacts 19, 20.

In certain embodiments, it is possible without great difficulty to dispose four or even eight memory chips 4 one on top of the other and to connect them by using bond-wires, as illustrated in FIGS. 2A and B or FIGS. 3A and B. Therefore, the example embodiment of FIGS. 2A and B could also include eight memory chips 4 (then each memory chip would store eight bits of a 64 bit-wide word) and the example embodiment of FIGS. 3A and B could include 16 memory chips 4 (two stacks of 8 memory chips respectively).

It is also possible for a memory circuit according to the embodiments to include more than two stacks, (e.g., four stacks). If each of these four stacks includes eight memory chips, the entire memory circuit then includes 32 memory chips. In the case of a memory circuit having more than two stacks, it may be desirable that the stacks are disposed in a point-symmetrical manner, so that the contacts 19, from which the CA-signals are distributed to all of the memory chips in all of the stacks, can be disposed in the centre of this arrangement.

Figure 4:
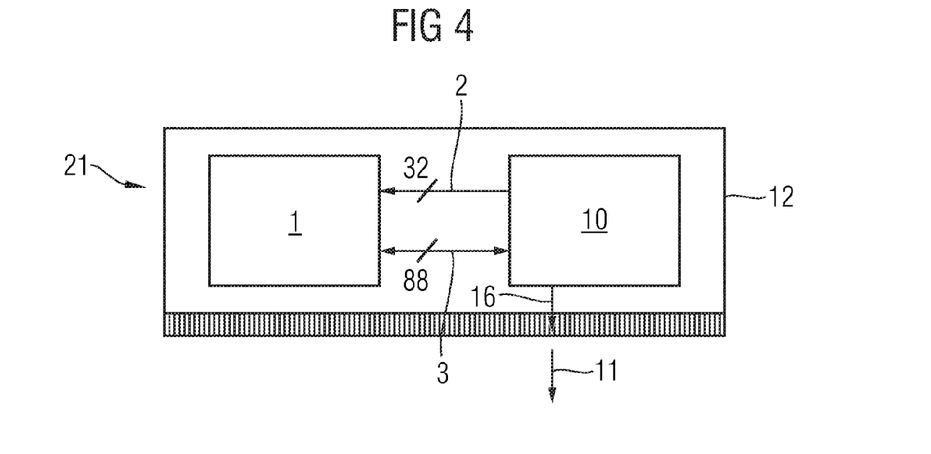
FIG. 4 illustrates one embodiment of memory assembly including a controller and a memory circuit.

FIG. 4 illustrates an embodiment of a memory assembly 21 which includes a memory circuit 1 and a controller 10 for the memory circuit 1 which are both disposed on a printed circuit board 12. The controller 10 in this embodiment is connected via a front-side-bus 16 to a CPU. The controller 10 is connected via 32 CA-lines 2 and via 88 DQ-lines 3 to the memory circuit 1. The controller 10 transmits via 32 CA-lines 2 control commands and addresses to the memory circuit 1, whereas mainly data is transmitted via the 88 DQ-lines from the controller 10 to the memory circuit 1 or is read out via the controller 10 by the memory circuit 1, in order then to relay the data via the front-side-bus 16 to the CPU.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory circuit comprising:
   multiple memory chips configured to store data and disposed in at least one stack, wherein each memory chip comprises multiple memory chip ports including at least one memory chip port which carries a data query (DQ)-signal and a specific memory chip port which carries a command address (CA)-signal;
   multiple ports configured to receive and transmit control signals and data to and from the memory chips and to supply energy to the memory circuit, wherein each memory chip port which carries a DQ-signal is connected to a different one of the ports of the memory circuit, respectively, wherein the CA-signal is connected from a port of the memory circuit to the specific memory chip ports of all of the memory chips; and
   a housing accommodating the multiple memory chips and the multiple ports.

2. The memory circuit according to claim 1, wherein the memory circuit is configured to function in a memory module.

3. The memory circuit according to claim 1, wherein the memory circuit is configured to function in a dual inline memory module (DIMM).

4. The memory circuit according to claim 1, wherein the multiple memory chips are disposed such that a length of any connection line from one of the ports of the memory circuit to a port of one of the memory chips is not longer than the sum of a longest edge length of one of the memory chips and a height of the memory circuit.

5. The memory circuit according to claim 4, wherein the length is at most 2 cm.

6. The memory circuit according to claim 1, wherein the memory chips are disposed in exactly one stack.

7. The memory circuit according to claim 1, wherein the memory chips are disposed adjacent to one another in exactly two stacks.

8. The memory circuit according to claim 1, wherein the memory chips are disposed in more than two stacks.

9. The memory circuit according to claim 1, wherein four or eight memory chips are disposed one on top of the other in the at least one stack.

10. The memory circuit according to claim 1, comprising:
a memory configured to store control information to control the memory circuit.

11. The memory circuit according to claim 1, wherein each port of the memory circuit comprises a soldering point.

12. The memory circuit according to claim 11, wherein each soldering point is disposed on the underside of the memory circuit.

13. The memory circuit according to claim 11, comprising:
a substrate, on the underside of which the soldering points are applied, wherein each soldering point is connected via a track conductor of the substrate to at least one bond-wire, wherein each bond-wire is connected to a port of one of the memory chips.

14. The memory circuit according to claim 1, wherein the memory circuit is configured to respond to the CA-signal, which is to be directed to the specific memory chip port of each memory chip, and is connected, starting from a contact of the memory circuit, in a star-like manner to the specific memory chip ports of all of the memory chips.

15. The memory circuit according to claim 1, wherein the memory circuit is configured to respond to the CA-signal, which is to be directed to the specific memory chip port of each memory chip, and is guided, starting from a contact of the memory circuit, by a through silicon via-technique to the specific memory chip ports of all of the memory chips.

16. A memory circuit comprising:
multiple memory chips configured to store data and disposed in at least one stack;
multiple ports configured to receive and transmit control signals and data to and from the memory chips and to supply energy to the memory circuit, wherein each port of one of the memory chips which carries a data query (DQ)-signal is connected to a different one of the ports of the memory circuit, respectively;
wherein the memory circuit is configured to respond to a command address (CA)-signal, which is to be directed to a specific memory chip port of each memory chip, and is connected, from a port of the memory circuit, to the specific memory chip ports of all of the memory chips; and
a housing accommodating the multiple memory chips and the multiple.

17. The memory circuit according to claim 16, wherein the memory circuit is configured to function in a dual inline memory module (DIMM).

18. The memory circuit according to claim 16, wherein the memory chips are disposed in exactly one stack.

19. The memory circuit according to claim 16, wherein the memory chips are disposed adjacent to one another in exactly two stacks.

20. The memory circuit according to claim 16, comprising:
wherein each port of the memory circuit comprises a soldering point disposed on the underside of the memory circuit; and
a substrate, on the underside of which the soldering points are applied, wherein each soldering point is connected via a track conductor of the substrate to at least one bond-wire, wherein each bond-wire is connected to a port of one of the memory chips.

21. A memory circuit comprising:
multiple memory chips configured to store data and disposed adjacent to another in two stacks;
a substrate; and
multiple soldering points configured as ports of the memory circuit on the underside of the substrate to receive and transmit control signals and data to and from the memory chips and to supply energy to the memory circuit, wherein each soldering point of the memory circuit which carries a command address (CA)-signal is connected via a track conductor of the substrate to one of several contacts between the two stacks, respectively, wherein each port of one of the memory chips which carries a data query (DQ)-signal is connected to a different one of the soldering points of the memory circuit, respectively.

22. The memory circuit of claim 21 wherein each contact is connected to a corresponding port of all memory chips.

23. A memory assembly comprising:
at least one memory circuit comprising:
multiple memory chips configured to store data and disposed in at least one stack, wherein each memory chip comprises multiple memory chip ports including at least one memory chip port which carries a data query (DQ)-signal and a specific memory chip port which carries a command address (CA)-signal;
multiple ports configured to receive and transmit control signals and data to and from the memory chips and to supply energy to the memory circuit, wherein each memory chip port which carries a DQ-signal is connected to a different one of the ports of the memory circuit, respectively, wherein the CA-signal is connected from a port of the memory circuit to the specific memory chip ports of all of the memory chips; and
a housing accommodating the multiple memory chips and the multiple ports; and
a controller configured to control the at least one memory circuit.

24. The memory assembly according to claim 23, wherein the distance between the controller and the at least one memory circuit is less than 4 cm.

25. The memory assembly according to claim 23, wherein the controller comprises a microprocessor.

26. The memory assembly according to claim 23, wherein the controller is configured to a maximum line length of 5 cm for lines between the controller and the memory chips of the at least one memory circuit.

27. A method of producing a memory circuit comprising multiple memory chips configured to store data and multiple ports configured to receive and transmit control signals and data to and from the memory chips and to supply energy to the memory circuit, wherein each memory chip comprises multiple memory chip ports including at least one memory chip port which carries a data query (DQ)-signal and a specific memory chip port which carries a command address (CA)-signal, the method comprising;
- disposing the multiple memory chips in at least one stack on a substrate;
- connecting each memory chip port which carries a DQ-signal to a different one of the ports of the memory circuit, respectively;
- connecting the CA-signal from a port of the memory circuit to the specific memory chip ports of all of the memory chips; and
- disposing a housing over the memory chips on the substrate.

28. The method according to claim 27, wherein the memory chips are disposed in exactly one stack.

29. The method according to claim 27, wherein the memory chips are disposed adjacent to one another in exactly two stacks.

30. The method according to claim 27, comprising:
- disposing a lowermost memory chip on the substrate as the first lower memory chip of the at least one stack;
- applying resin to the respective lower memory chip in an alternating manner up to an uppermost memory chip of the at least one stack; and
- disposing a further memory chip of the at least one stack on the resin.

31. The method according to claim 27, comprising:
- applying soldering points on the underside of the substrate;
- producing, for each soldering point, a track conductor from the underside of the substrate to the top side of the substrate;
- connecting each track conductor on the top side of the substrate to one end of at least one bond-wire; and
- connecting another end of each bond-wire to a port of one of the memory chips.

* * * * *